United States Patent
Wang et al.

(10) Patent No.: US 8,906,798 B2
(45) Date of Patent: Dec. 9, 2014

(54) METHODS OF MANUFACTURING STRESS BUFFER STRUCTURES IN A MOUNTING STRUCTURE OF A SEMICONDUCTOR DEVICE

(71) Applicant: Taiwan Semiconductor Manufacturing Company, Ltd., Hsinchu (TW)

(72) Inventors: Tzu-Yu Wang, Taipei (TW); Tzu-Wei Chiu, Hsinchu (TW); Shin-Puu Jeng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/714,828

(22) Filed: Dec. 14, 2012

(65) Prior Publication Data

US 2013/0109169 A1    May 2, 2013

Related U.S. Application Data

(62) Division of application No. 12/697,473, filed on Feb. 1, 2010, now Pat. No. 8,354,750.

(51) Int. Cl.
*H01L 21/60* (2006.01)

(52) U.S. Cl.
USPC ........... 438/613; 438/612; 438/614; 438/637; 438/638; 257/E21.509

(58) Field of Classification Search
USPC .......................... 257/737–738, 779–780, 787
See application file for complete search history.

(56) References Cited

U.S. PATENT DOCUMENTS

| | | | |
|---|---|---|---|
| 6,117,299 A | 9/2000 | Rinne et al. | |
| 6,586,323 B1 * | 7/2003 | Fan et al. | 438/614 |
| 2006/0170102 A1 * | 8/2006 | Ko | 257/738 |
| 2007/0216028 A1 | 9/2007 | Lee et al. | |
| 2008/0122086 A1 * | 5/2008 | Tsao et al. | 257/738 |
| 2009/0087984 A1 * | 4/2009 | Akutagawa et al. | 438/658 |
| 2009/0283311 A1 | 11/2009 | Ida | |

* cited by examiner

*Primary Examiner* — Thanh Nguyen
(74) *Attorney, Agent, or Firm* — Lowe Hauptman & Ham, LLP

(57) ABSTRACT

A mounting structure for a semiconductor device is formed to include a stepwise stress buffer layer under a stepwise UBM structure.

20 Claims, 14 Drawing Sheets

METHODS OF MANUFACTURING STRESS BUFFER STRUCTURES IN A MOUNTING STRUCTURE OF A SEMICONDUCTOR DEVICE

RELATED APPLICATION(S)

The instant application is a divisional application of U.S. patent application Ser. No. 12/697,473 filed Feb. 1, 2010, titled "STRESS BUFFER STRUCTURES IN A MOUNTING STRUCTURE OF A SEMICONDUCTOR DEVICE AND METHODS OF MANUFACTURING THE SAME."

TECHNICAL FIELD

The present disclosure relates to stress buffer structures for a mounting structure of a semiconductor device and methods of manufacturing the same.

BACKGROUND

Recently, there has been a trend in miniaturizing integrated circuits (ICs), requiring a high I/O (input/output) density which, in turn, requires small-size bonding pads. Such bonding pads are often formed on the active surface of a chip and define the places where the circuits of the chip are electrically connected to external devices. Bonding wires have become increasingly unpopular due to various potential problems, such as short circuits or inconsistent or inadequate bond strengths. Therefore, a flip chip technique has been introduced. According to this technique, solder bumps are formed on bonding pads of a chip, and the chip is mounted directly on a substrate by reflowing the solder bumps. The final product is often referred to as a ball grid array (BGA) or a flip chip ball grid array (FCBGA) chip or package.

To promote adhesion between the solder bump and the bonding pad, an under bump metallurgy or under bump metallization (UBM) structure is interposed between the solder bump and the bonding pad. UBM structures can also perform other functions, for example, as a barrier for preventing diffusion of the solder material into the bonding pad or even into the semiconductor material of the chip. A typical UBM structure includes several metal layers each performing a desired function.

Due to the concentration of multiple material layers of a UBM structure and a solder bump at and in the vicinity of each bonding pad, there is also a concentration of stress in this area. Such a stress, without preventive measure, may become sufficiently large to cause damage to inter-level dielectric (ILD) layers of the chip that are located immediately below or adjacent the bonding pad. Particularly sensitive to stress are low-k (low dielectric constant material) layers which are brittle and, in some applications, porous. Such low-k layers are easy to crack and/or delaminate under stress.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Throughout the description presented below, it will be understood that when a layer is referred to as being 'on' or 'over' another layer or substrate, it can be in direct contact with the other layer or substrate, or intervening layers may also be present therebetween.

Figure 1:
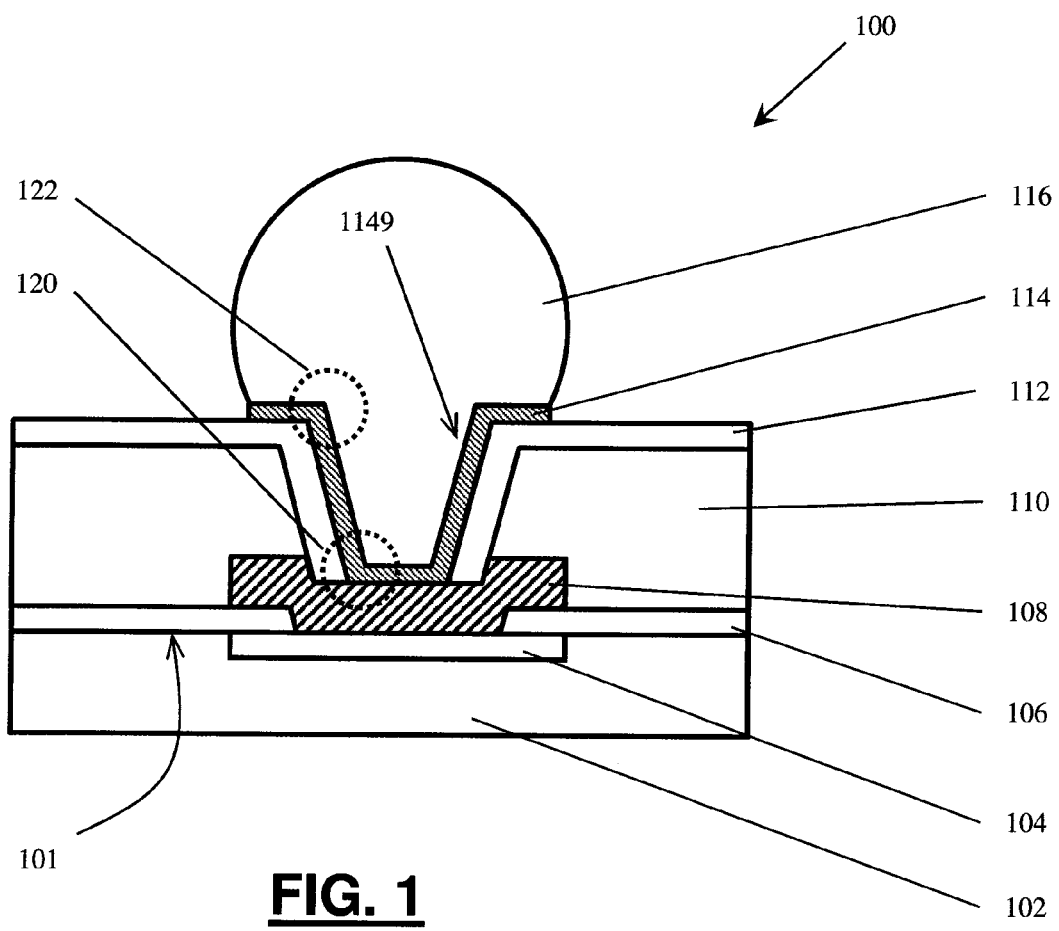
FIG. 1 is a schematic, cross-sectional view of a solder bump structure in a semiconductor device.

FIG. 1 is a schematic, cross-sectional view of a solder bump structure 100 known to the inventors. Solder bump structure 100 is formed on an active surface 101 of a wafer or chip 102 of a semiconductor device, and includes a first passivation layer 106, a bonding pad 108, a second passivation layer 110, a PI (polyimide) layer 112, a UBM structure 114 and a solder bump 116 formed one on top another in the recited order. Chip 102 includes, under bonding pad 108, a top-level metal 104 electrically connected to bonding pad 108. The top-level metal 104 is a portion of an interconnection structure within chip 102. The interconnection structure of chip 102 further includes, under and/or in the vicinity of top-level metal 104, one or more dielectric layers (not shown) which, as discussed above, are often made of low-k or extreme low-k materials that are brittle and susceptible to cracks or delamination.

The inventors have found that solder bump structure 100 generally creates a high stress concentration at upper and lower corners 120, 122 of UBM structure 114. The stress distribution depends, among other things, on the inclination angle of a sidewall 1149 of UBM structure 114. Specifically, the inventors have discovered that at a relatively acute inclination angle (e.g., 40° with respect to active surface 101) of sidewall 1149, stress is largely concentrated around lower corner 120. As the inclination angle of sidewall 1149 increases toward 90°, the stress concentration shifts towards upper corner 122. However, at any inclination angle, high stress is still transmitted to the dielectric layers of the interconnection structure underneath corners 120, 122 and increases the possibility of cracks in or delamination of the dielectric layers.

Figure 2A:
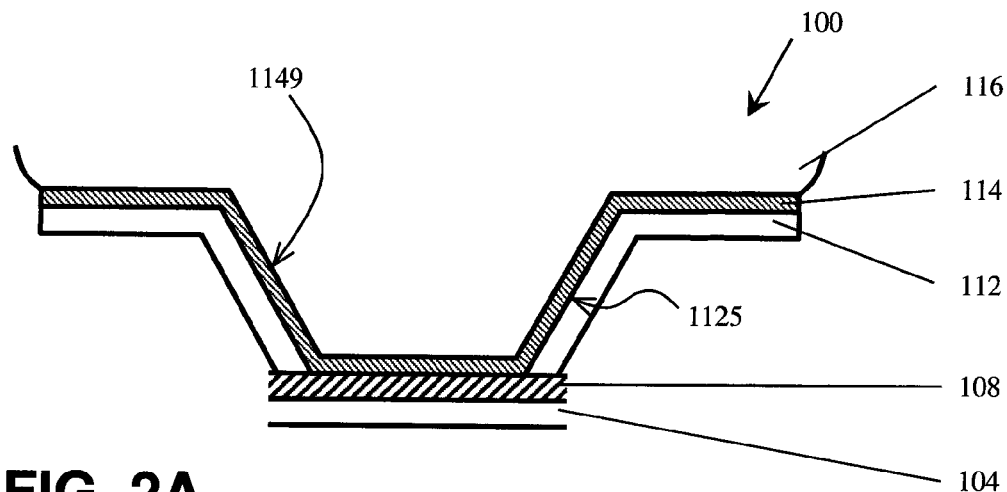
FIGS. 2A-2C are schematic, simplified cross-sectional views of several bonding structures for the solder bump structure.
Figure 2B:
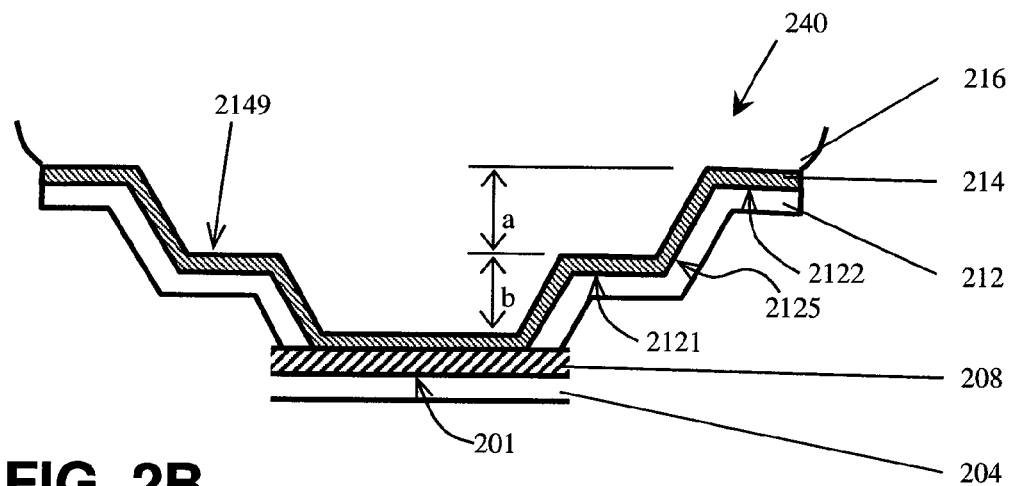
Figure 2C:
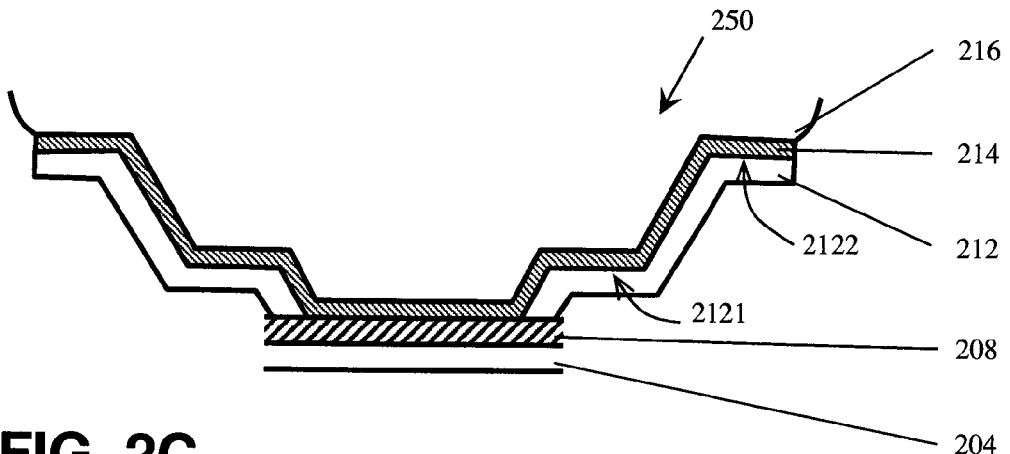

FIG. 2A is a simplified or partial view of solder bump structure 100 of FIG. 1. FIGS. 2B-2C are views similar to FIG. 2A and show solder bump structures 240, 250 in accordance with various embodiments.

Specifically, solder bump structure 240 of FIG. 2B is formed on an active surface 201 of a semiconductor wafer or chip (not shown) of a semiconductor device. Solder bump structure 240 includes a bonding pad 208, a stress buffer structure 212, a UBM structure 214 and a solder bump 216 (partially shown) formed one on top another in the recited order. Under bonding pad 208, the chip includes an interconnection structure comprising multiple conductive and dielectric layers alternatingly arranged one on top another. For the sake of simplicity, only a top-level conductive layer, e.g., a top metal layer, 204 of the interconnection structure is shown in the figure. The interconnection structure further includes, under and/or in the vicinity of top metal 204, one or more dielectric layers (not shown) which, in some embodiments, are made of low-k or extreme low-k materials. Solder bump structure 240 defines a mounting structure for the chip when the chip is flipped over and placed on a carrier, such as a substrate or lead frame (not shown) and solder bump 216 is re-flown. In some embodiments, the chip comprises multiple bonding pads 208 for which multiple solder bump structures 240 are provided.

Stress buffer structure 212 defines a distinction from PI layer 112 of solder bump structure 100 in FIGS. 1 and 2A. In particular, PI layer 112 has a sidewall 112S that monotonously extends upward from bonding pad 108, i.e., sidewall 112S extends at a uniform slope from the bonding pad. As a result, UBM structure 114 formed on PI layer 112 and conforming in shape to PI layer 112 also has monotonously extending sidewall 114P. Such solder bump structure 100, as discussed above, is likely to cause stress concentration on the underlying layers, such as low-k or extremely low-k dielectric layers, of the chip.

To the contrary, stress buffer structure 212 of solder bump structure 240 in FIG. 2B does not have a monotonously extending sidewall. Instead, sidewall 212S of stress buffer structure 212 extends in a stepwise manner upwardly from bonding pad 208. Sidewall 212S includes at least two steps above the level of bonding pad 208, namely lower step 2121 and upper step 2122 which have respective heights b and a as exemplarily depicted in FIG. 2B. Since sidewall 212S of stress buffer structure 212 is stepwise, UBM structure 214, which is formed on stress buffer structure 212 and conforms in shape to stress buffer structure 212, also has a stepwise sidewall 214P. As discussed in detail herein below, the stepwise configuration of UBM structure 214 and stress buffer structure 212 results in a more uniform distribution of stress on the underlying layers, such as low-k or extremely low-k dielectric layers. The stepwise configuration further reduces the maximum and/or average values of stress compared to solder bump structure 100.

Solder bump structure 250 in FIG. 2C is similar to solder bump structure 240, except for the height ratio between steps, such as lower step 2121 and upper step 2122. The particular illustrated configuration in FIG. 2B has an approximately 1:1 height ratio, i.e., the height b of lower step 2121 and the height of upper step 2122 are about the same. The particular illustrated configuration in FIG. 2C has an approximately 2:1 height ratio, i.e., upper step 2122 is about twice as high as lower step 2121.

Figure 3A:
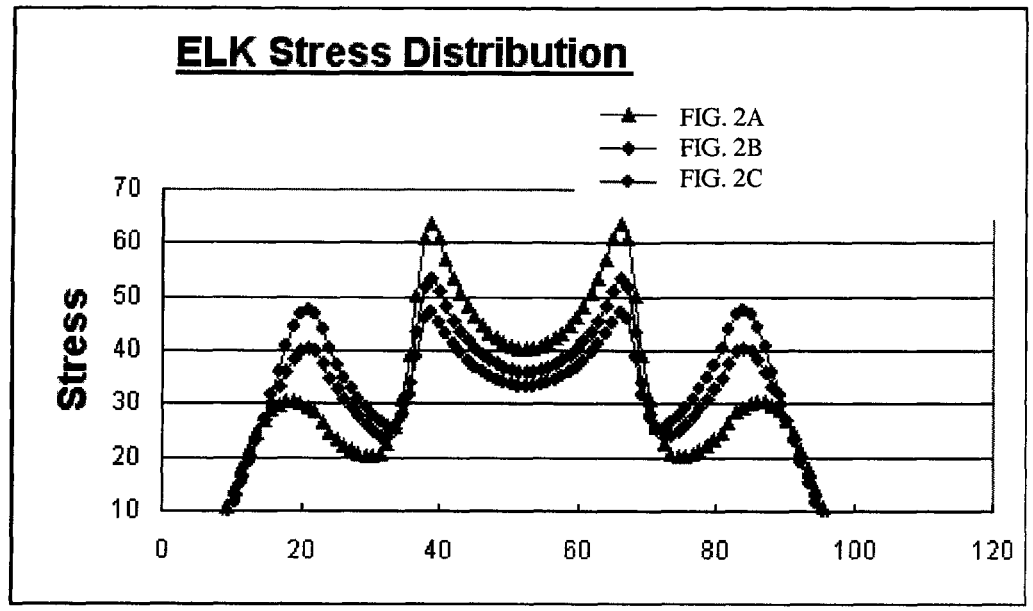
FIGS. 3A-3B are graphs comparing stress distributions and stress values, respectively, in the bonding structures of FIGS. 2A-2C.
Figure 3B:
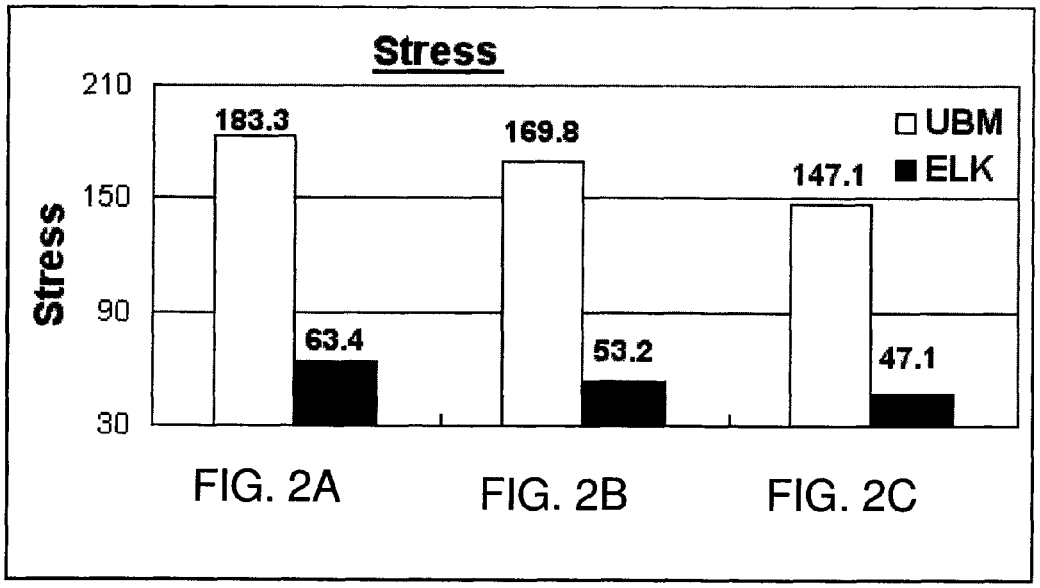

Assuming that all characteristics (i.e., materials, thicknesses etc.) of solder bump structures 100, 240 and 250 are the same, except for the particular shapes and the particular height ratios (applicable to FIGS. 2B-2C) of PI layer 112/stress buffer structure 212 and corresponding UBM structures, the results of performing a computer simulation of stress generation are shown in FIGS. 3A-3B.

FIG. 3A is a graph of stress distribution in the underlying low-k or extremely low-k dielectric (ELK) materials, e.g., under top metal layers 104, 204, in solder bump structures 100, 240 and 250. The stress distribution of solder bump structure 100 in FIG. 2A is most uneven, having very high peaks (maximum stress values) at locations corresponding to lower corners 120 (FIG. 1). The stress distribution of solder bump structure 240 in FIG. 2B is more uniform than that of solder bump structure 100 in FIG. 2A, having lower high peaks. The stress distribution of solder bump structure 250 in FIG. 2C is even more uniform that that of solder bump structure 240 in FIG. 2B, having even lower high peaks. As a result, the maximum stress values are reduced from solder bump structure 100 down to solder bump structure 240 and further down to solder bump structure 250. Thus, high stress concentrations are less severe in solder bump structure 240 and solder bump structure 250 than in solder bump structure 100.

The average stress values are also improved. FIG. 3B is a graph showing average stress values in the underlying low-k or extremely low-k dielectric (ELK) materials, e.g., under top metal layers 104, 204, and in the overlying UBM structures, such as UBM structures 114, 214. As apparent from FIG. 3B, average stress values, across the width of the UBM structure, in both the underlying dielectric materials and the UBM structures decrease from solder bump structure 100 to solder bump structure 240 and further to solder bump structure 250. The average stress value in the underlying dielectric materials is reduced more than 25% (from 63.4 to 47.1) and the average stress value in the UBM structure is reduced for about 20% (from 183.3 to 147.1).

Thus, the stepwise configuration of the UBM structure and the stress buffer structure results in more uniform stress distribution and lower maximum/average stress values in both the underlying dielectric materials of the chip and in the UBM structure itself. In numerous unshown embodiments, by varying the number of steps (e.g., forming more than two steps) and/or the heights and/or height ratios among the steps of such stepwise configuration, stress values and distributions in the UBM structure as well as the underlying dielectric materials of the chip can be optimized as desired. Such stress optimization is performed either independently of or in combination with other adjustments, such as the thickness of the stress buffer structure (also referred to as "PI thickness" in some embodiments) and/or the size of the opening in the stress buffer structure (also referred to as "PI opening" in some embodiments) and/or the inclination angle of the sidewall of the opening.

Stress buffer structure 212 includes one or more material layers. For simplicity, only one layer of stress buffer structure 212 is shown in FIGS. 2B-2C. Such layer is made of a stress buffer material and defines stepwise wall 212S of stress buffer structure 212 and, hence, corresponding stepwise wall 214P of UBM structure 214. The stress buffer material in some embodiments is a polymer. The polymer in one or more embodiments is selected from the group consisting of polyimide, polybenzoxazole (PBO), epoxy-based polymers, phenol-based polymers, and benzocyclobutene (BCB).

In some embodiments, a passivation layer (not shown in FIGS. 2B-2C) similar to second passivation layer 110 of solder bump structure 100 is provided under stress buffer structure 212 to adjust the height of stress buffer structure 212 without requiring a large amount of the stress buffer material. In further embodiments, multiple layers of one or more stress buffer materials are deposited on top the other to define stress buffer structure 212, either entirely or in combination with a passivation layer.

FIGS. 4A-4H are schematic cross-sectional views showing various steps of manufacturing a bonding structure for a semiconductor device 400 (FIG. 4H) according to some embodiments.

Figure 4A:
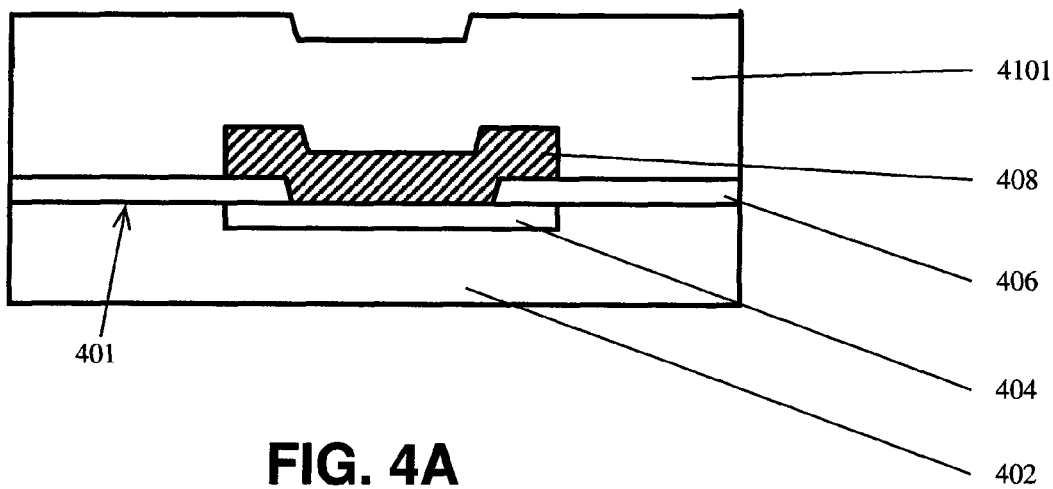
FIGS. 4A-4H are schematic cross-sectional views showing various steps of manufacturing a bonding structure for a semiconductor device according to some embodiments.

In FIG. 4A, a semiconductor substrate 402 is provided. Semiconductor substrate 402 is, in some embodiments, a wafer. In further embodiments, semiconductor substrate 402 is a chip having internal circuitry and active surface 401.

Semiconductor substrate 402 includes a top-level conductive layer, e.g., a top metal layer 404. Semiconductor substrate 402 further includes, under and/or in the vicinity of top metal 404, one or more dielectric layers (not shown) which are, in some embodiments, made of low-k or extremely low-k materials that are brittle and susceptible to cracks or delamination.

A first passivation layer 406 is formed on active surface 401 to partially cover top metal layer 404. The part of top metal layer 404 that is not covered by first passivation layer 406 is exposed in a first opening also referred to herein as the first passivation opening. Passivation layer 406 in some embodiments comprises an oxide layer or a nitride layer, such as silicone oxide or silicon nitride. In further embodiments, first passivation layer 406 comprises polyimide. An exemplary process of forming first passivation layer 406 includes depositing (e.g., by chemical vapor deposition—CVD) a passivation material on active surface 401 and then etching away a portion of the passivation material to form the first passivation opening.

A conductive material is subsequently deposited in the first passivation opening, and on a top surface of first passivation layer 406 around the first passivation opening to form a bonding pad 408. In some embodiments, bonding pad 408 is confined within the first passivation opening, without being deposited on the top surface of first passivation layer 406. The conductive material of bonding pad 408 comprises Al or Cu and is deposited to be in electrical contact (e.g., via a conductive via) with the internal circuitry of semiconductor substrate or chip 402.

A passivation material layer 4101 is deposited on bonding pad 408 and first passivation layer 406 as shown in FIG. 4A. Passivation material layer 4101 in the particularly illustrated embodiment has a top surface conforming in shape to the underlying bonding pad 408. In further embodiments, the top surface of passivation material layer 4101 is planarized prior to subsequent processing. Passivation material layer 4101 is made of the same as or similar material to first passivation layer 406.

Figure 4B:
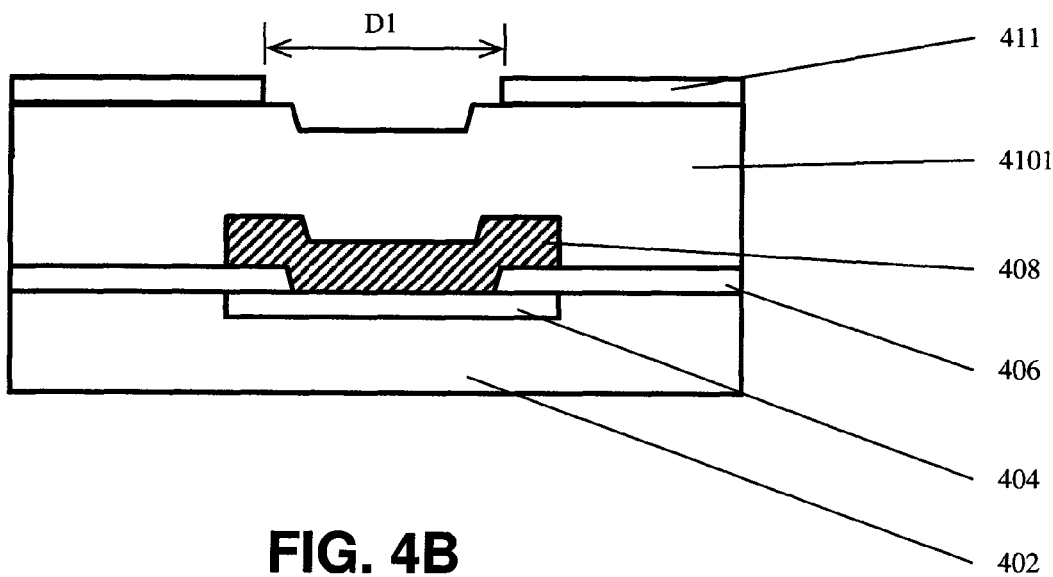

In FIG. 4B, a mask 411 having an opening D1 is used to partially remove an exposed portion of passivation material layer 4101. For example, mask 411 comprises a photoresist deposited and then photo-lithographically patterned on the top surface of passivation material layer 4101. The removal of passivation material layer 4101 is performed by, e.g., a first etching process.

Figure 4C:
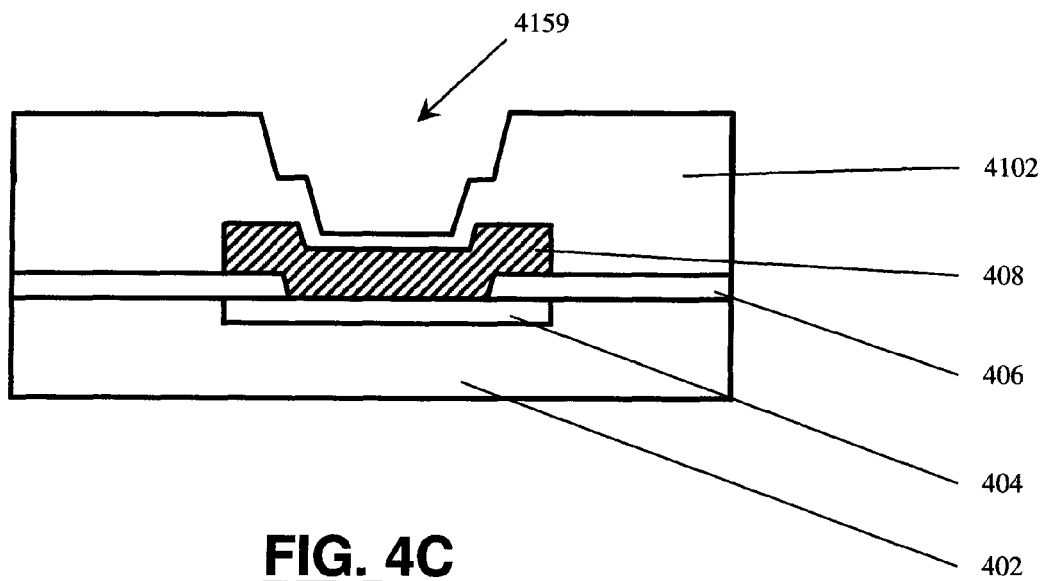

FIG. 4C shows the result of the first etching process and after mask 411 is removed. Specifically, a second passivation opening 4159 is formed in passivation material layer 4101. The once patterned passivation material layer 4101 will be referred to herein as passivation material layer 4102. In some embodiments, as shown in FIG. 4C, the etching of passivation material layer 4101 stops before bonding pad 408 is exposed. Consequently, a stepwise configuration with at least three steps will be obtained as disclosed herein below. In other embodiments, the etching of passivation material layer 4101 is performed until bonding pad 408 is exposed. As a result, a stepwise configuration with at least two steps will be obtained.

Figure 4D:
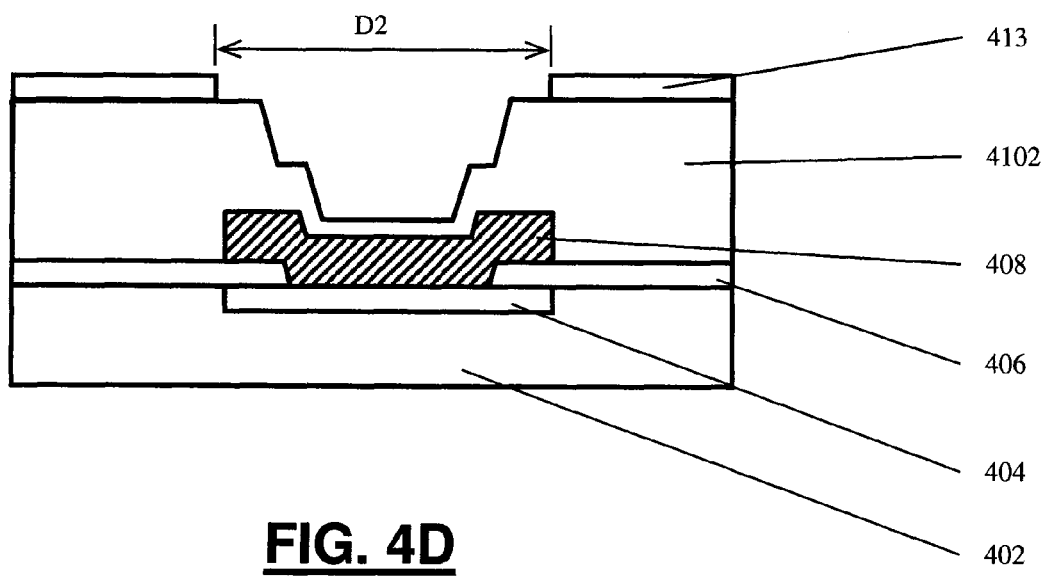

In FIG. 4D, a further mask 413 having an opening D2 greater than D1 is used to further remove, e.g., by a second etching process, an exposed portion of passivation material layer 4102. For example, mask 413 is formed similarly to mask 411.

Figure 4E:
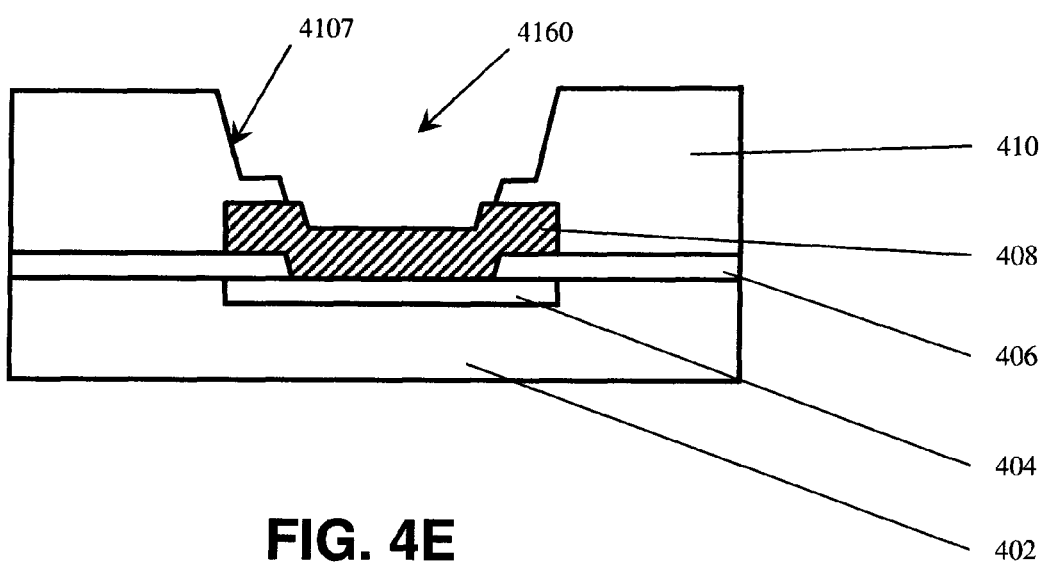

FIG. 4E shows the result of the second etching process and after mask 413 is removed. Specifically, second passivation opening 4159 is enlarged and denoted as 4160. The twice patterned passivation material layer 4101 has now become a second passivation layer 410. As shown in FIG. 4E, second passivation layer 410 has a stepwise wall 4107. The second etching process of passivation material layer 4102 is performed until bonding pad 408 is exposed.

FIG. 4E shows the result of the second etching process and after mask 413 is removed. Specifically, second passivation opening 4159 is enlarged and now denoted as 4160. The twice patterned passivation material layer 4101 has now become a second passivation layer 410. As shown in FIG. 4E, second passivation layer 410 has a stepwise wall 4107.

Figure 4F:
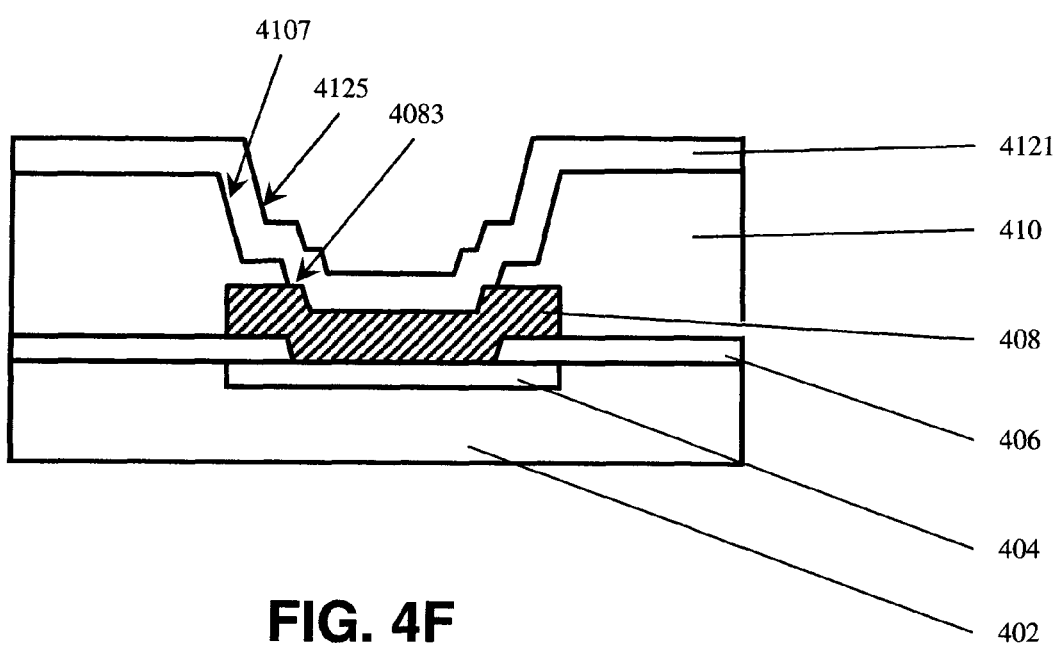

In FIG. 4F, a stress buffer material layer 4121 is deposited, e.g., by spin-coating, on second passivation layer 410, in second passivation opening 4160 and on the exposed portion of bonding pad 408. A sidewall 4125 of stress buffer material layer 4121 has two upper steps conforming in shape to stepwise wall 4107 of second passivation layer 410. Sidewall 4125 of stress buffer material layer 4121 further has a lower step conforming in shape to a raised portion 4083 of bonding pad 408.

Figure 4G:
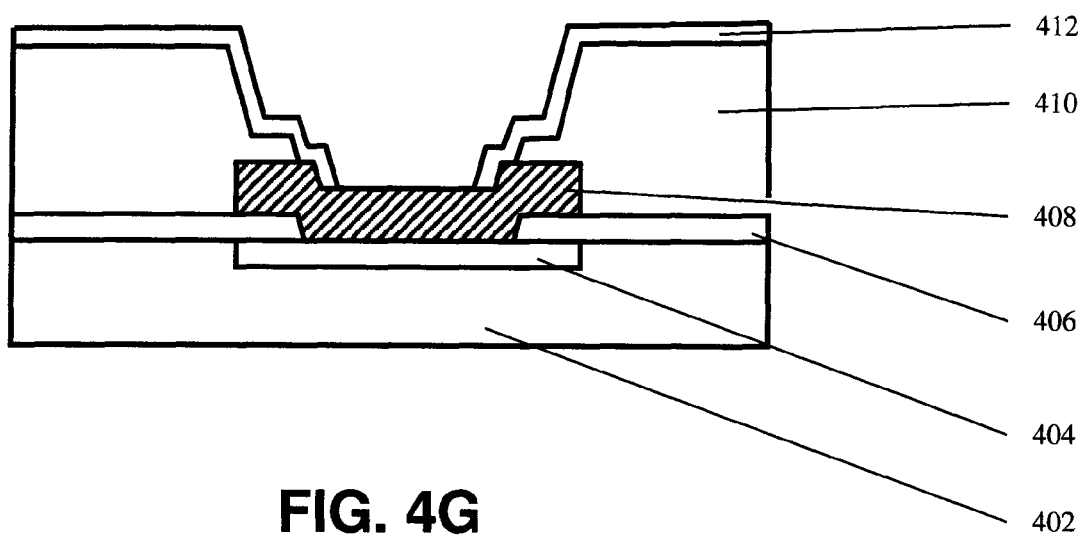

In FIG. 4G, the portion of stress buffer material layer 4121 at the bottom of second passivation opening 4160 is removed to expose a portion of bonding pad 408, using, for example, well-known patterning methods including photolithography and etching processes. The so formed and patterned stress buffer material layer 4121 has now become a stress buffer structure 412 having a stepwise configuration with three steps.

Figure 4H:
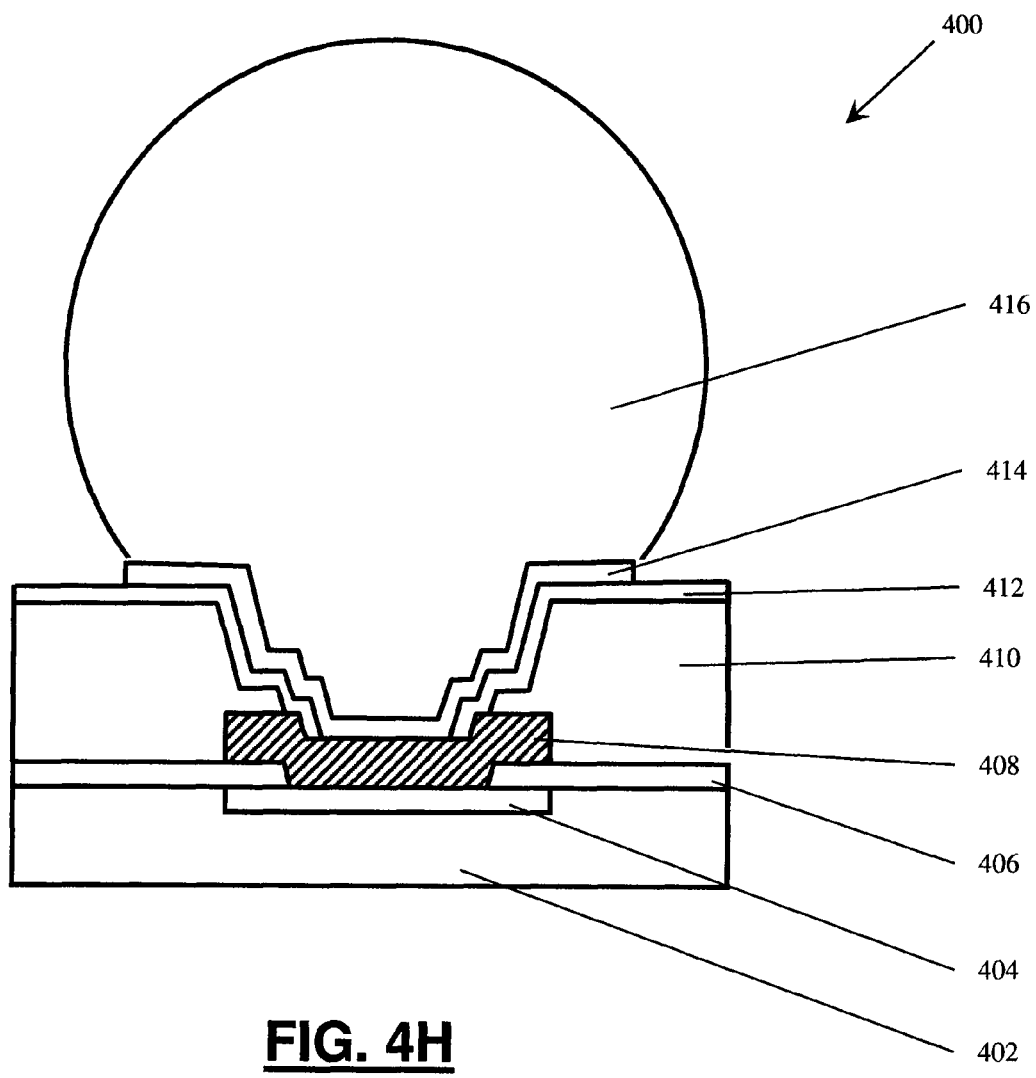

In FIG. 4H, an UBM structure 414 is deposited on stress buffer structure 412, conforming in shape to stress buffer structure 412 and in electrical contact with the exposed portion of bonding pad 408. UBM structure 414 includes one or more layers of at least one metal selected from the group consisting of Cr, Ti, Ni, W, Pt, Cu, Pd, Au, Ag and alloys thereof. UBM structure 414 is formed by sequentially depositing, e.g., by CVD, plating or sputtering, the component layers on bonding pad 408, and then etching away, e.g., by dry etching or wet etching, the unwanted portions. A solder bump 416 is formed on UBM structure 414 to complete semiconductor device 400.

FIGS. 5A-5D are schematic cross-sectional views showing various steps of manufacturing a bonding structure for a semiconductor device 500 (FIG. 5D) according to some embodiments.

Figure 5A:
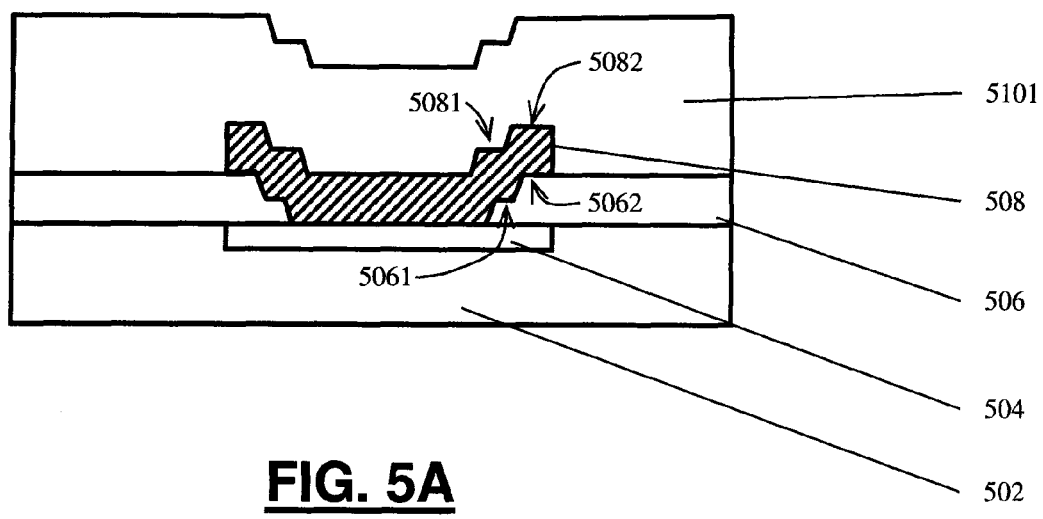
FIGS. 5A-5D are schematic cross-sectional views showing various steps of manufacturing a bonding structure for a semiconductor device according to further embodiments.

In FIG. 5A, a semiconductor substrate 502 similar to semiconductor substrate 402 is provided. Semiconductor substrate 502 includes a top-level conductive layer, e.g., a top metal layer 504 similar to top metal layer 404. A first passivation layer 506, a bonding pad 508 and a passivation material layer 5101 similar to first passivation layer 406, bonding pad 408, passivation material layer 4101, respectively, are formed on semiconductor substrate 502 in manners substantially similar to those described with respect to FIG. 4A.

A difference between FIGS. 5A and 4A is that in FIG. 5A, first passivation layer 506 is patterned more than once, e.g., twice, whereas in FIG. 4A, first passivation layer 406 is patterned once. As the result the first passivation opening in first passivation layer 506 has a stepwise sidewall as shown in FIG. 5A. An exemplary process of forming the stepwise first passivation opening is similar to that described with respect to FIGS. 4B-4E, e.g., by two etching processes with two differently sized masks. Other methods are, however, not excluded.

A further difference between FIGS. 5A and 4A is that bonding pad 508 formed on and conforming in shape to underlying first passivation layer 506 also has a stepwise configuration. Specifically, bonding pad 508 has a lower step 5081 and an upper step 5082 corresponding to a lower step 5061 and an upper step 5062 of first passivation layer 506, respectively. In some embodiments (not shown), bonding pad 508 is confined within a boundary defined by upper step 5062 of first passivation layer 506, and therefore has a configuration similar to that of FIG. 4A.

Figure 5B:
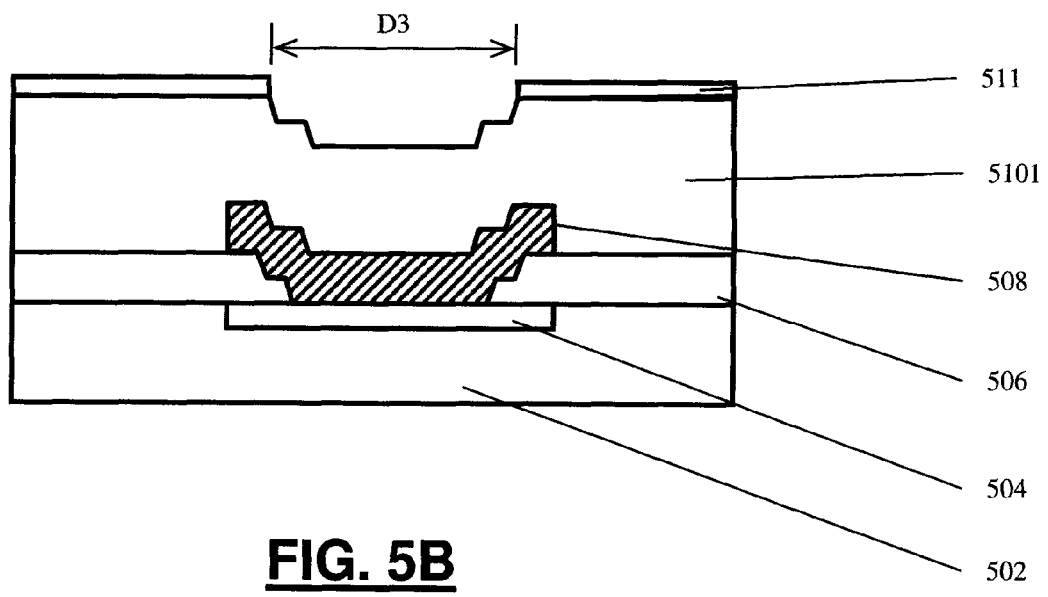

In FIG. 5B, a mask 511 similar to mask 411 and having an opening D3 is used to remove an exposed portion of passivation material layer 5101, in a manner similar to that described with respect to FIG. 4B.

Figure 5C:
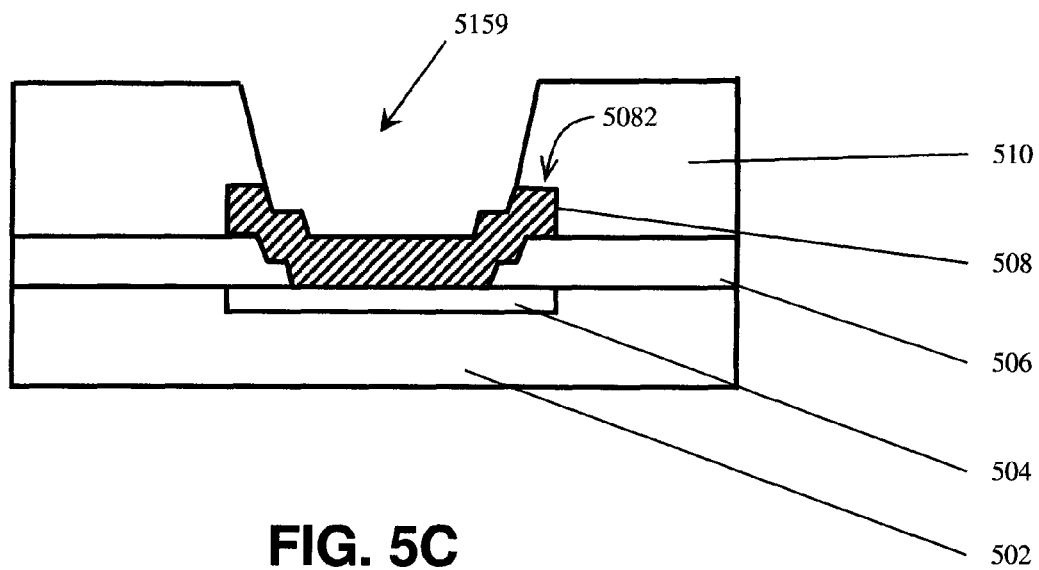

FIG. 5C shows the result of the etching process of FIG. 5B and after mask 511 is removed. Specifically, a second passivation opening 5159 is formed in the once patterned passivation material layer 5101 which has now become second passivation layer 510. The etching of passivation material layer 5101 stops upon or after bonding pad 508 is exposed. A top surface of upper step 5082 of bonding pad 508 is buried in second passivation layer 510, and therefore a stepwise configuration with at least two steps will be obtained as disclosed herein below.

Figure 5D:
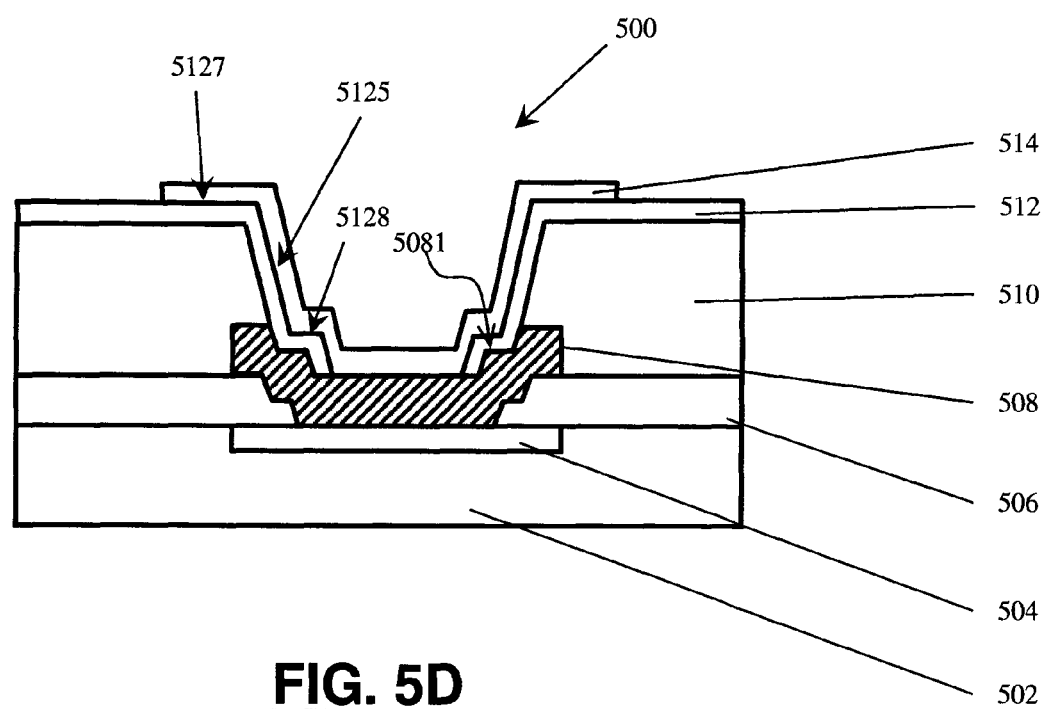

In FIG. 5D, a stress buffer material layer is deposited and patterned to define stress buffer structure 512 in manners similar to those described with respect to FIGS. 4F-4G. A sidewall 5125 of stress buffer material layer 512 has an upper step 5127 corresponding to a top surface of second passivation layer 510, and a lower step 5128 corresponding to lower step 5081 of bonding pad 508.

An UBM structure 514 is deposited on stress buffer structure 512, conforming in shape to stress buffer structure 512 and in electrical contact with the exposed middle portion of bonding pad 508 in manners similar to those described with respect to FIG. 4H. A solder bump (not shown in FIG. 5D) is formed on UBM structure 514 to complete semiconductor device 500.

Figure 6A:
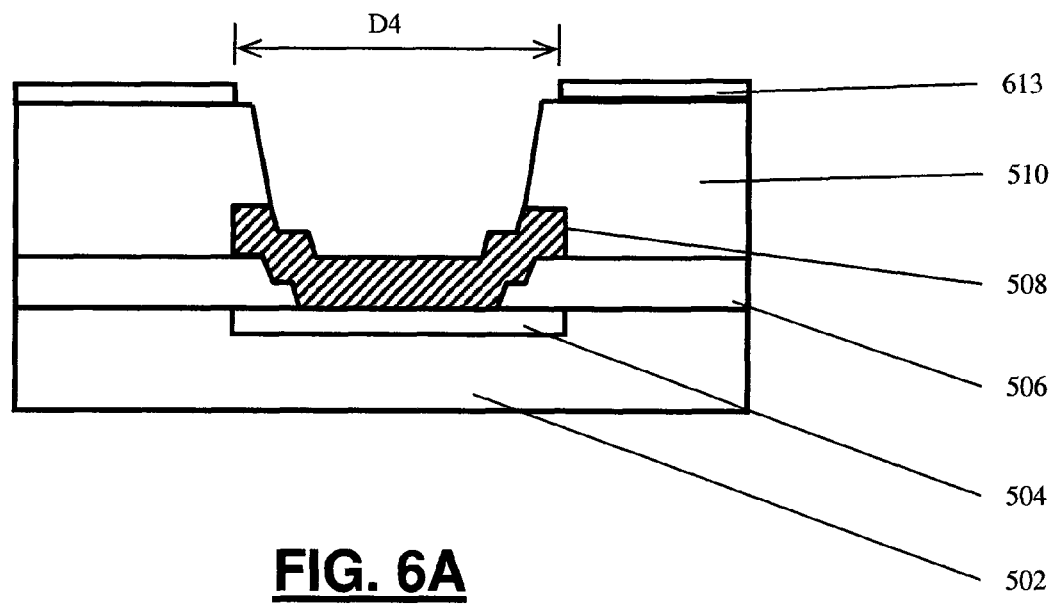
FIGS. 6A-6B are schematic cross-sectional views showing various steps of manufacturing a bonding structure for a semiconductor device according to yet further embodiments.
Figure 6B:
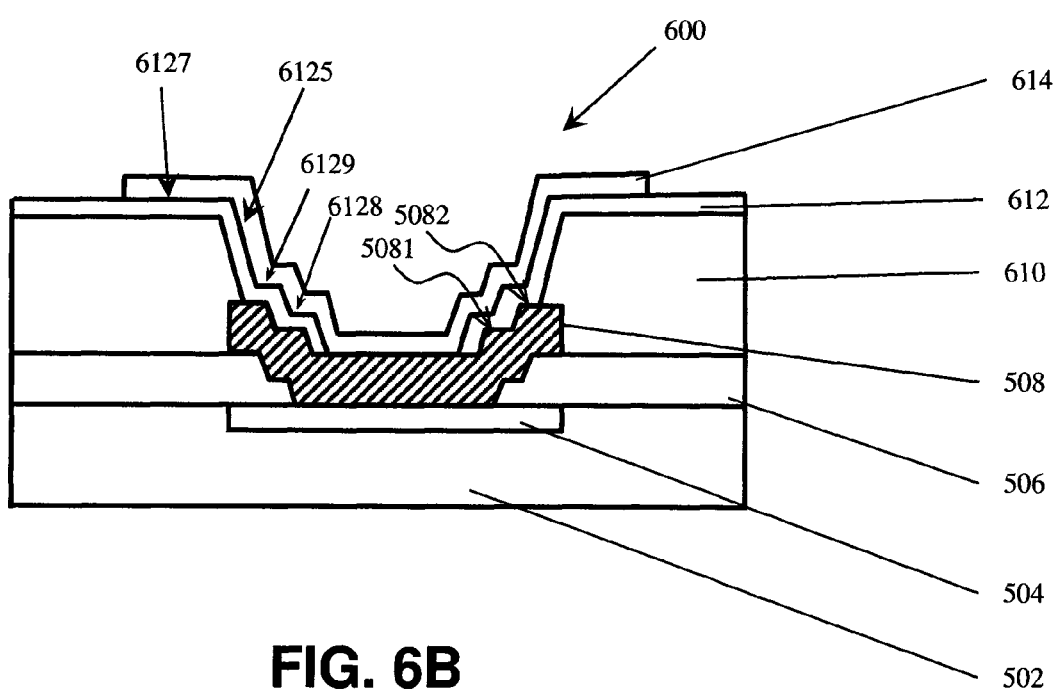

FIGS. 6A-6B are schematic cross-sectional views showing various steps of manufacturing a bonding structure for a semiconductor device 600 (FIG. 6B) according to some embodiments.

FIG. 6A is a continuation to the step of FIG. 5C, in that a mask 613 having an opening D4 greater than D3 is used for further etching second passivation layer 510 to obtain stress buffer structure 612 (FIG. 6B). Thus, the second passivation opening 5159 in FIG. 5C is widened, and as a result, a top surface of upper step 5082 of bonding pad 508 is exposed, and defines a further step of the final stepwise configuration shown in FIG. 6B.

Specifically, in FIG. 6B, a sidewall 6125 of stress buffer material layer 612 has an upper step 6127 corresponding to a top surface of second passivation layer 610, a lower step 6128 corresponding to lower step 5081 of bonding pad 508, and a middle step 6129 corresponding to the top surface of upper step 5082 of bonding pad 508.

An UBM structure 614 is deposited on stress buffer structure 612, conforming in shape to stress buffer structure 612 and in electrical contact with the exposed middle portion of bonding pad 508 in manners disclosed herein. A solder bump (not shown in FIG. 6B) is formed on UBM structure 614 to complete semiconductor device 600.

In some embodiments, mask 613 is used instead of, rather than in combination with, mask 511 to etch passivation material layer 5101 as shown in FIG. 5B, to obtain a semiconductor device similar to semiconductor device 600.

Figure 7A:
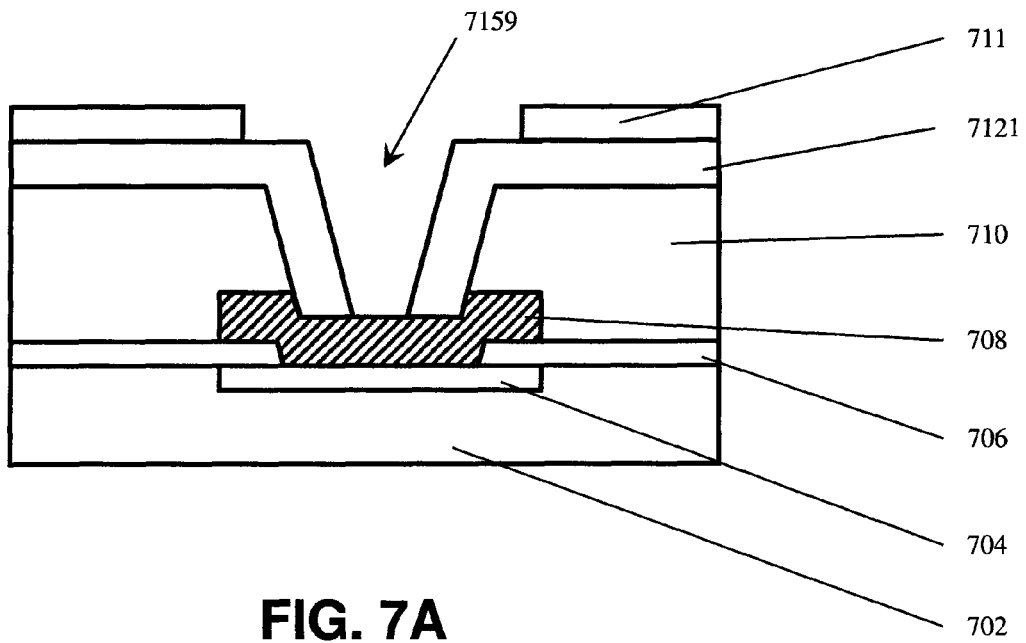
FIGS. 7A-7C are schematic cross-sectional views showing various steps of manufacturing a bonding structure for a semiconductor device according to still further embodiments.
Figure 7B:
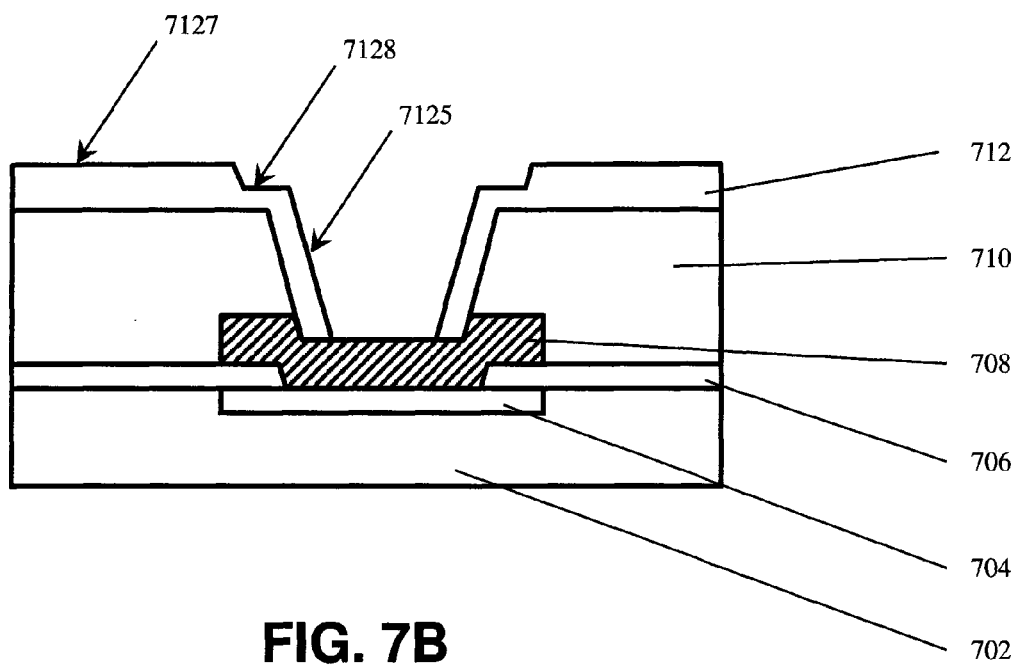
Figure 7C:
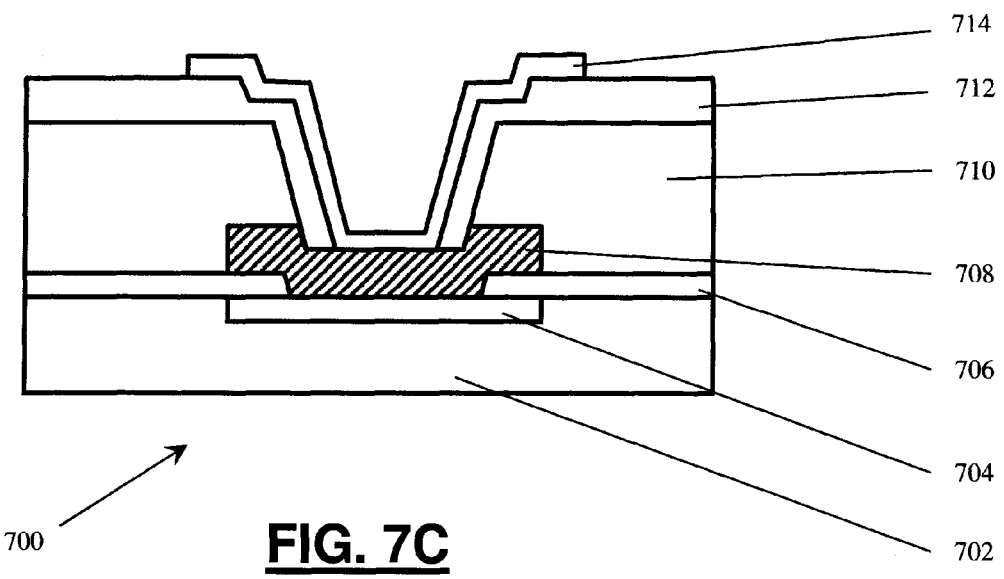

FIGS. 7A-7C are schematic cross-sectional views showing various steps of manufacturing a bonding structure for a semiconductor device 700 (FIG. 7C) according to some embodiments.

FIG. 7A shows a state of the semiconductor device as being manufactured by several processes similar to those disclosed with respect to FIGS. 4A-4C and 4F-4H. Specifically, a semiconductor substrate 702 in FIG. 7A is similar to semiconductor substrate 402. Semiconductor substrate 702 includes a top-level conductive layer, e.g., a top metal layer 704 similar to top metal layer 404. A first passivation layer 706, a bonding pad 708 and a passivation material layer (not shown) similar to first passivation layer 406, bonding pad 408, passivation material layer 4101, respectively, are formed on semiconductor substrate 702 in manners substantially similar to those described with respect to FIG. 4A.

The passivation material layer is patterned with a mask similar to that described with respect to FIG. 4B.

The patterning of the passivation material layer, unlike the process particularly shown in FIG. 4C, is performed until the middle portion of bonding pad 708 is exposed, thereby obtaining a second passivation layer 710.

A stress buffer material layer (not shown) is deposited on the patterned second passivation layer 710 as described with respect to FIG. 4F, and patterned as described with respect to FIG. 4G, thereby obtaining a patterned stress buffer material layer 7121 as illustrated in FIG. 7A.

A mask 711 similar to mask 411 and having an opening (not numbered) wider than that of second passivation opening 7159 formed in second passivation layer 710 is used to remove a partial thickness of an exposed portion of patterned stress buffer material layer 7121 around second passivation opening 7159 to obtain a stress buffer structure 712 as shown in FIG. 7B.

FIG. 7B shows the result of the etching process of FIG. 7A and after mask 711 is removed. Specifically, the partial thickness removal of patterned stress buffer material layer 7121 creates a stepwise wall 7125 for stress buffer structure 712. In particular, sidewall 7125 of stress buffer material layer 712 has an upper step 7127 corresponding to a top surface of patterned stress buffer material layer 7121 before the second etching process, and a lower step 7128 corresponding to a top surface of the stress buffer material layer 7121 around second passivation opening 7159 after the second etching process. Thus, a stepwise configuration of two steps is obtained.

In FIG. 7C, an UBM structure 714 is deposited on stress buffer structure 712, conforming in shape to stress buffer structure 712 and in electrical contact with the exposed middle portion of bonding pad 708 in manners similar to those described with respect to FIG. 4H. A solder bump (not shown in FIG. 7C) is formed on UBM structure 714 to complete semiconductor device 700.

Figure 8A:
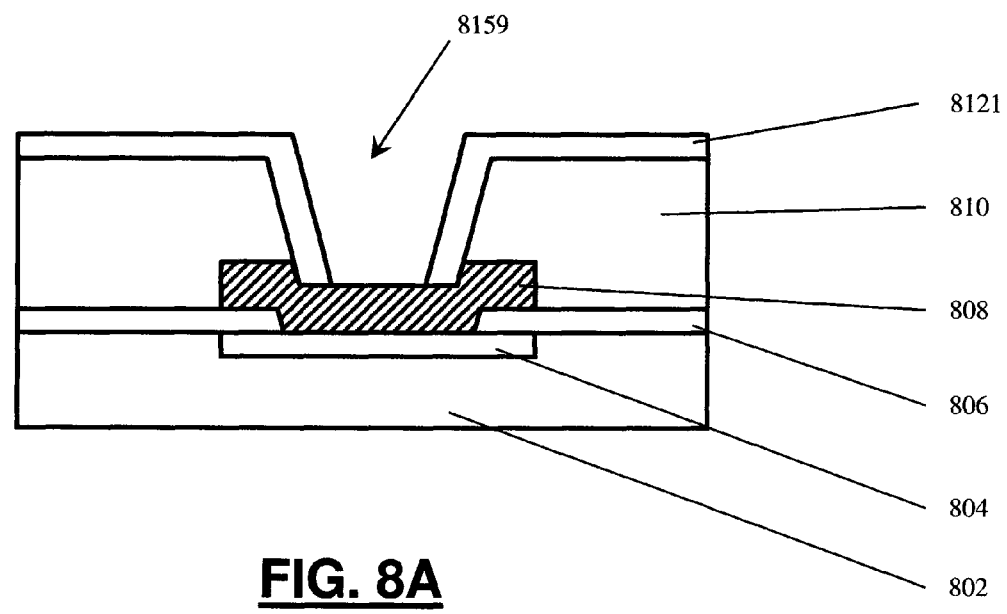
FIGS. 8A-8C are schematic cross-sectional views showing various steps of manufacturing a bonding structure for a semiconductor device according to some other embodiments.
Figure 8B:
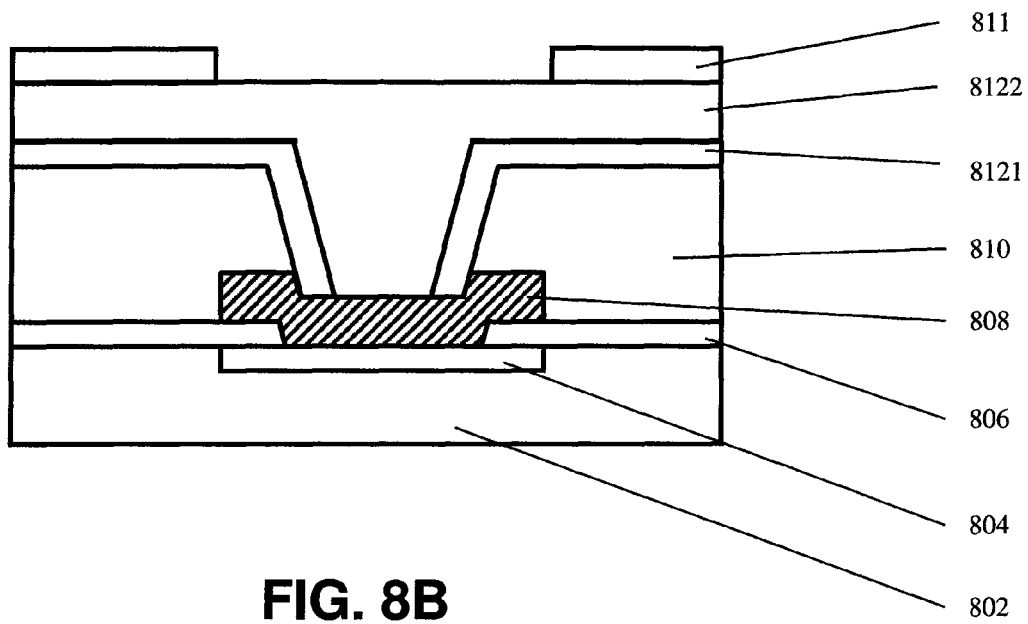
Figure 8C:
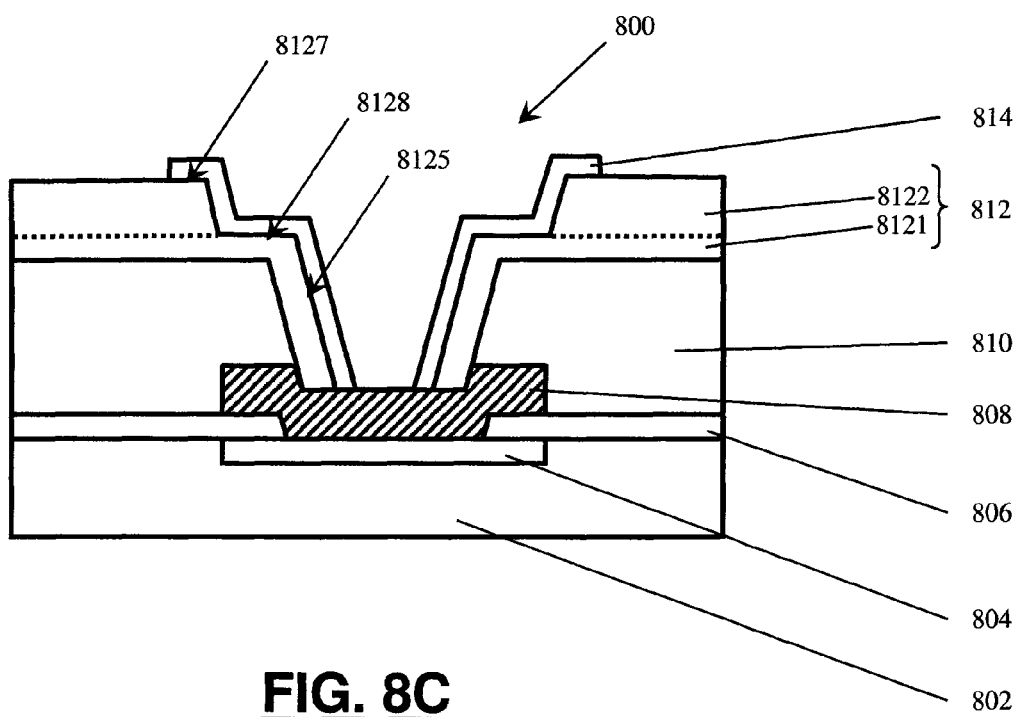

FIGS. 8A-8C are schematic cross-sectional views showing various steps of manufacturing a bonding structure for a semiconductor device 800 (FIG. 8C) according to some embodiments.

FIG. 8A is similar to FIG. 7A, without mask 711. Thus, a semiconductor substrate 802 in FIG. 8A is similar to semiconductor substrate 702. Semiconductor substrate 802 includes a top-level conductive layer, e.g., a top metal layer 804 similar to top metal layer 704. A first passivation layer 806, a bonding pad 808, a second passivation layer 810 and a patterned stress buffer material layer 8121 similar to first passivation layer 706, bonding pad 708, second passivation layer 710 and patterned stress buffer material layer 7121, respectively, are formed on semiconductor substrate 802 in manners disclosed herein. A second passivation opening 8159 similar to second passivation opening 7159 is also formed.

In FIG. 8B, instead of immediately etching the structure shown in FIG. 8A with a mask as discussed with respect to FIG. 7A, a second stress buffer material layer 8122 is filled in second passivation opening 8159 and deposited to a desired thickness on patterned stress buffer material layer 8121. A spin-coating process is used in some embodiments for forming such second stress buffer material layer 8122. A mask 811 of a desired opening (not numbered) is then used to etch away the exposed portion of second stress buffer material layer 8122 in second passivation opening 8159 and on top of patterned stress buffer material layer 8121. The etch selectivity of stress buffer materials of patterned stress buffer material layer 8121 and second stress buffer material layer 8122 is chosen such that the exposed portion of second stress buffer material layer 8122 is removed without significantly effecting the thickness of patterned stress buffer material layer 8121 within the opening of mask 811.

FIG. 8C shows the result of the etching process of FIG. 8B and after mask 811 is removed. A stress buffer structure 812, which is a combination of a remainder of second stress buffer material layer 8122 and patterned stress buffer material layer 8121, is obtained with a stepwise wall 8125. Sidewall 8125 of stress buffer material layer 812 has an upper step 8127 corresponding to a top surface of second stress buffer material layer 8122 and a lower step 8128 corresponding to a top surface of patterned stress buffer material layer 8121. Thus, a stepwise configuration of two steps is obtained. The height ratio of the steps of the stepwise configuration can be adjusted by simply adjusting the thickness of second stress buffer material layer 8122 in relation to a depth of second passivation opening 8159 (FIG. 8A).

An UBM structure 814 is deposited on stress buffer structure 812, conforming in shape to stress buffer structure 812 and in electrical contact with the exposed middle portion of bonding pad 808 in manners similar to those described with respect to FIG. 4H. A solder bump (not shown in FIG. 8C) is formed on UBM structure 814 to complete semiconductor device 800.

In some embodiments, a method is provided for manufacturing a mounting structure for a semiconductor device having an active surface. A bonding pad is formed over the active surface of the semiconductor device. A stress buffer layer having a stepwise sidewall is formed over a peripheral portion of the bonding pad, while leaving a middle portion of the bonding pad exposed. An under-bump metallurgy (UBM) layer is formed over the exposed middle portion of the bonding pad and over the stepwise wall of the stress buffer layer, such that said UBM layer conforms in shape to said stepwise wall. A solder bump is formed over the UBM layer.

In some embodiments, a method is provided for manufacturing a mounting structure for a semiconductor device having an active surface. A bonding pad is formed over the active surface of the semiconductor device. The bonding pad comprises a middle portion, a peripheral portion raised relative to the middle portion, and a sidewall connecting an upper surface of the middle portion and an upper surface of the raised peripheral portion. A stress buffer structure is formed in direct contact with the sidewall of the bonding pad, and covering at least partially the raised peripheral portion while exposing at least partially the middle portion of the bonding pad. The stress buffer structure has a stepwise sidewall that extends, in steps, upwardly from an exposed part of the middle portion of the bonding pad. An under-bump metallurgy (UBM) layer is formed over the exposed part of the bonding pad and over the stepwise wall of the stress buffer structure, such that the UBM layer conforms in shape to the stepwise wall.

In some embodiments, a method is provided for manufacturing a mounting structure for a semiconductor device having an active surface. A lower passivation layer is formed over the active surface. A bonding pad is formed over the active surface and the lower passivation layer. The bonding pad has a stepwise configuration defined by the lower passivation layer. An upper passivation layer is formed over the active surface and the bonding pad, while leaving a middle portion of the bonding pad exposed. A stress buffer layer is formed over the upper passivation layer and the exposed middle portion of the bonding pad, without completely covering the middle portion of the bonding pad. The stress buffer layer has a stepwise sidewall corresponding at least partially to the stepwise configuration of the bonding pad. An under-bump metallurgy (UBM) layer is formed over the exposed middle portion of the bonding pad and over the stepwise wall of the stress buffer layer, such that said UBM layer conforms in shape to said stepwise wall.

The foregoing has outlined features of several embodiments so that those skilled in the art may better understand the detailed description that follows. Those skilled in the art should appreciate that they may readily use the present disclosure as a basis for modifying other processes and structures for carrying out one or more of the same or similar purposes and/or achieving one or more of the same or similar advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a mounting structure for a semiconductor device having an active surface, said method comprising:
   forming a bonding pad over the active surface of the semiconductor device;
   forming a stress buffer layer having a stepwise sidewall over a peripheral portion of the bonding pad, while leaving a middle portion of the bonding pad exposed;
   forming an under-bump metallurgy (UBM) layer over the exposed middle portion of the bonding pad and over the stepwise wall of the stress buffer layer, such that said UBM layer conforms in shape to said stepwise wall; and
   forming a solder bump over the UBM layer;
   wherein said forming the bonding pad comprises forming the bonding pad to have a stepwise configuration which defines at least partially the stepwise sidewall of the stress buffer layer when the stress buffer layer is formed over the bonding pad.

2. The method of claim 1, further comprising:
   patterning the stress buffer layer to have a stepwise configuration which defines the stepwise sidewall of the stress buffer layer.

3. The method of claim 1, further comprising, before forming said stress buffer layer:
   forming an upper passivation layer over the active surface and the bonding pad; and
   patterning the upper passivation layer to have a stepwise configuration which defines at least partially the stepwise sidewall of the stress buffer layer when the stress buffer layer is formed over the upper passivation layer.

4. The method of claim 1, further comprising, before forming said bonding pads:
   forming a lower passivation layer over the active surface; and
   patterning the lower passivation layer to have a stepwise configuration which defines the corresponding stepwise configuration of the bonding pad when the bonding pad is formed over the lower passivation layer.

5. The method of claim 1, wherein
   said method further comprises forming a passivation layer over the active surface and the bonding pad to have a further stepwise configuration at least partially conforming in shape to the stepwise configuration of the bonding pad, and the stress buffer layer is formed over the passivation layer to have the stepwise sidewall at least partially conforming in shape to the stepwise configurations of the bonding pad and the passivation layer.

6. The method of claim 5, wherein the stress buffer layer is formed to have the stepwise wall comprising an upper step and a lower step, and a height of the upper step is equal to or higher than a height of the lower step.

7. The method of claim 1, wherein the stress buffer layer is formed to have the stepwise wall comprising more than two steps.

8. The method of claim 1, wherein the bonding pad comprises:
    a middle portion,
    a peripheral portion raised relative to the middle portion, and
    a sidewall connecting an upper surface of the middle portion and an upper surface of the raised peripheral portion;

the method further comprises
    forming a passivation layer over at least a portion of the raised peripheral portion of the bonding pad; and the stress buffer polymer layer is formed over the passivation layer and in direct contact with the sidewall of the bonding pad.

9. The method according to claim 8, wherein the stress buffer layer is formed to be in direct contact with the upper surface of the raised peripheral portion of the bonding pad.

10. The method of claim 8, wherein the passivation layer is formed to comprise two steps corresponding to two steps of the stepwise wall of the stress buffer layer.

11. The method of claim 1, wherein the stress buffer layer comprises at least one selected from the group consisting of polybenzoxazole (PBO), epoxy-based polymers, and phenol-based polymers.

12. A method of manufacturing a mounting structure for a semiconductor device having an active surface, said method comprising:
    forming a lower passivation layer over the active surface;
    forming a bonding pad over the active surface and the lower passivation layer, the bonding pad having a stepwise configuration defined by the lower passivation layer;
    forming an upper passivation layer over the active surface and the bonding pad, while leaving a middle portion of the bonding pad exposed;
    forming a stress buffer layer over the upper passivation layer and the exposed middle portion of the bonding pad, without completely covering the middle portion of the bonding pad, the stress buffer layer having a stepwise sidewall corresponding at least partially to the stepwise configuration of the bonding pad; and
    forming an under-bump metallurgy (UBM) layer over the exposed middle portion of the bonding pad and over the stepwise wall of the stress buffer layer, such that said UBM layer conforms in shape to said stepwise wall, wherein
    the upper passivation layer is formed by one selected from the group consisting of a first process, a second process and a third process;

the first process comprises:
    depositing a layer of passivation material over the active surface and the bonding pad;
    performing a first etching to form an opening in the deposited layer of passivation material, without exposing the middle portion of the bonding pad; and
    performing a second etching to enlarge a diameter of the opening in the deposited layer of passivation material and to expose the middle portion of the bonding pad;

the second process comprises:
    forming a layer of passivation material over the active surface and the bonding pad, the layer of passivation material having an opening exposing the middle portion of the bonding pad; and
    partially removing a thickness of the layer of passivation material around the opening; and the third process comprises:
    forming a first layer of passivation material over the active surface and the bonding pad, the first layer of passivation material having an opening exposing the middle portion of the bonding pad;
    forming a second layer of passivation material over the first layer of passivation material and in the opening; and
    removing the second layer of passivation material from within and around the opening.

13. The method of claim 12, further comprising:
    forming a solder bump over the UBM layer.

14. The method of claim 12, wherein the stress buffer layer comprises at least one selected from the group consisting of polybenzoxazole (PBO), epoxy-based polymers, and phenol-based polymers.

15. The method of claim 12, wherein the stress buffer layer comprises at least one selected from the group consisting of polyimide and benzocyclobutene (BCB).

16. A method of manufacturing a mounting structure for a semiconductor device having an active surface, said method comprising:
    forming a lower passivation layer over the active surface;
    forming a bonding pad over the active surface and the lower passivation layer, the bonding pad having a stepwise configuration defined by the lower passivation layer;
    forming an upper passivation layer over the active surface and the bonding pad, while leaving a middle portion of the bonding pad exposed;
    forming a stress buffer layer over the upper passivation layer and the exposed middle portion of the bonding pad, without completely covering the middle portion of the bonding pad, the stress buffer layer having a stepwise sidewall corresponding at least partially to the stepwise configuration of the bonding pad; and
    forming an under-bump metallurgy (UBM) layer over the exposed middle portion of the bonding pad and over the stepwise wall of the stress buffer layer, such that said UBM layer conforms in shape to said stepwise wall;
    wherein said forming the lower passivation layer comprises:
        depositing a layer of passivation material over the active surface; and
        patterning the deposited layer of passivation material into the lower passivation layer having a further stepwise configuration which defines the stepwise configuration of the bonding pad when the bonding pad is formed over the lower passivation layer.

17. The method of claim 16, wherein said forming the upper passivation layer comprises:
    depositing a further layer of passivation material over the active surface and the bonding pad;

performing a first etching to form an opening in the deposited further layer of passivation material, without exposing the middle portion of the bonding pad;

performing a second etching to enlarge a diameter of the opening in the deposited further layer of passivation material and to expose the middle portion of the bonding pad.

18. The method of claim 16, further comprising:
forming a solder bump over the UBM layer.

19. The method of claim 16, wherein the stress buffer layer comprises at least one selected from the group consisting of polybenzoxazole (PBO), epoxy-based polymers, and phenol-based polymers.

20. The method of claim 16, wherein the stress buffer layer comprises at least one selected from the group consisting of polyimide and benzocyclobutene (BCB).

* * * * *